United States Patent [19]

Hargita et al.

[11] 4,287,394

[45] Sep. 1, 1981

[54] KEYBOARD SWITCH ASSEMBLY WITH PRINTED CIRCUIT BOARD

[75] Inventors: Tibor Hargita, Munich; Ingo Berlitz, Putzbrunn; Herbert Hafner, Höhenkirchen, all of Fed. Rep. of Germany

[73] Assignee: Wilhelm Ruf KG, Munich, Fed. Rep. of Germany

[21] Appl. No.: 6,697

[22] Filed: Jan. 25, 1979

Related U.S. Application Data

[63] Continuation-in-part of Ser. No. 802,104, May 31, 1977, abandoned.

[30] Foreign Application Priority Data

Jul. 31, 1976 [DE] Fed. Rep. of Germany ....... 7624175

[51] Int. Cl.3 ...................... H01H 13/70; H05K 1/00; G11C 11/00

[52] U.S. Cl. .................................. 200/5 A; 174/68.5; 200/159 B; 200/267; 200/292; 361/416

[58] Field of Search ........... 200/5 A, 267, 292, 159 B; 174/68.5; 361/416

[56] References Cited

U.S. PATENT DOCUMENTS

| | | | |
|---|---|---|---|
| 3,560,256 | 2/1971 | Abrams | 174/68.5 |
| 3,665,126 | 5/1972 | Gabor | 200/5 A |
| 3,699,294 | 10/1972 | Sudduth | 200/5 A X |
| 3,732,389 | 5/1973 | Kaelin et al. | 200/5 A X |
| 3,760,137 | 9/1973 | Shimojo et al. | 200/5 A X |
| 3,796,843 | 3/1974 | Durkee et al. | 200/5 A |
| 3,932,722 | 1/1976 | Obata et al. | 200/5 A X |
| 3,996,430 | 12/1976 | Eberwein et al. | 200/5 A |
| 4,180,711 | 12/1979 | Hirata et al. | 200/267 X |

OTHER PUBLICATIONS

Webster's New World Dictionary of the American Language, College Edition, World Publishing Co., 1968, pp. 615 and 1612.

*Primary Examiner*—James R. Scott

*Attorney, Agent, or Firm*—Sprung, Felfe, Horn, Lynch & Kramer

[57] ABSTRACT

A circuit board and a method of making same having a plurality of conductor lines wherein at least one portion of at least one line is superimposed over a portion of at least one other line to define at least one intersection. A substrate is provided of insulating material and a first insulating coating is applied to at least one side of the substrate. A first set of conductive nonintersecting lines is applied to the varnished coating and a coating of insulating varnish is applied on and around the conductive lines only in the vicinity of the intersection. A second set of nonintersecting conductive lines define the intersection with the first set by being applied onto the substrate. The circuit board may be used in a multiple circuit keyboard switch assembly. A conventional type pushbutton bridging contact array selectively interconnects conductor lines at particular switch sites.

8 Claims, 6 Drawing Figures

KEYBOARD SWITCH ASSEMBLY WITH PRINTED CIRCUIT BOARD

RELATED APPLICATIONS

This application is a continuation in part of U.S. applicant Ser. No. 802,104, filed May 31, 1977, now abandoned.

BACKGROUND

The invention relates to a method of preparing printed circuit boards, in which contact strips or electrical connection pads or conductive strips which cross one another with the interposition of an insulating layer are formed on a substrate of insulating material. The invention furthermore relates to a circuit board prepared by this method.

U.S. abandoned patent application Ser. No. 802,104 discloses a keyboard for ultrasonic and infrared remote control devices for electronic entertainment apparatus and for the operation of projectors as well as small electronic calculators, which consist essentially of a circuit board with conductor strips and switch contact surfaces and inexpensive pushbutton switches which are in electrical working connection with the switch contact surfaces of the printed circuit board.

For the improvement of the overall construction and for the simplification of the component parts, the circuit board of insulating material is provided with crossing conductor strips, the intersections between the first and second and additional superimposed conductor strips having electrically insulating layers. These electrically insulating layers can in a preferred manner consist of an insulating varnish. The advantage of such a keyboard is that, even in the case of a great number of required switch contact surfaces and conductor strips, only one circuit board is needed, with contact strips and switch contact surfaces applied to only one side. Furthermore, the special technique of the crossing conductor strips permits a circuit board of a small surface area, permitting the construction of handy, relatively small remote control apparatus.

It has been found, however, that especially where the conductor strips are close together, a migration of silver from one conductor strip of positive potential to an adjacent conductor strip of negative potential occurs, so that, especially in an environment of high atmospheric humidity, measurable short circuits can develop.

Attempts have been made to obviate this disadvantage by making the conductor strips only of silver, but making the switch points of a resistance coating of varnish and carbon black, referred to hereinafter as conductive varnish. Nevertheless, the problem mentioned above has not been solved in this manner, since the hard paper board used as the substrate absorbs moisture, and the silver of the conductor strips diffuses into the hard paper, and in this hard paper a galvanic migration of the silver ions occurs, so that, after a certain time of operation, the same undesirable situation develops.

THE INVENTION

The object of the invention is to create a circuit board and a method of manufacturing same, in which very close spacing between the conductor strips is possible, and yet the conductor strips can be made in silver but the formation of leakage currents and measurable short circuits is prevented.

Setting out from the method of the initially defined type, this object is achieved in accordance with the invention in that first a layer of varnish is applied to the substrate of insulating material, then the conductor strips of metal are applied to the varnish coating, insulating varnish is applied to the intersections of the conductor strips, and on that the intersecting conductor strips of metal are formed, and then all of the conductor strips are covered over with a coating of varnish made electrically conductive.

By means of the varnish coating, silver ions are prevented from migrating into the planar substrate, so that, even in the case of relatively high humidity, and with the use of a hard paper circuit board, the galvanic migration of silver ions is prevented.

By means of the conductive varnish coating which covers all the conductor strips, the migration of silver on the surface of the circuit board is furthermore effectively prevented.

In particular, the invention can be advantageously improved by using conductive varnish strips instead of the conductor strips consisting of metal. In this case the prime varnish coat can be omitted.

The method of the invention, however, is not limited to the formation of conductor strips on one side of a substrate. Instead, both sides of the substrate can first be provided with a varnish coating, the conductor strips consisting of a metal-containing conductive paste or the conductive varnish can be applied thereon, and in the case of metal conductor strips, the latter can be covered over by a coat of conductive varnish.

A circuit board produced by the method of the invention therefore consists of the following layers:

On a substrate of insulating material, which in a preferred manner can consist of hard paper, there is formed a varnish coating on one or on both sides, on the latter the various layers of conductor strips and any desired crossing conductor strips with interposed insulating layer can be formed, and finally on the latter conductor strips a protective coating of conductive varnish is formed. In those areas where conductors will intersect, the superimposed portions are separated by a layer of insulating varnish.

The substrate can thus consist of hard paper and the conductor strips of silver, very close spacing being possible between the individual conductor strips and also between the terminals or contact points.

It is desirable to apply the coat of conductive varnish to the conductor strips such that they are hermetically sealed in on the one hand by the coating of varnish and on the other hand by the conductive varnish coat.

BRIEF DESCRIPTION OF THE DRAWINGS

Additional advantages and details of the invention will appear from the following description of an embodiment in conjunction with the drawings in which.

DETAILED DESCRIPTION OF THE INVENTION

Figure 1:
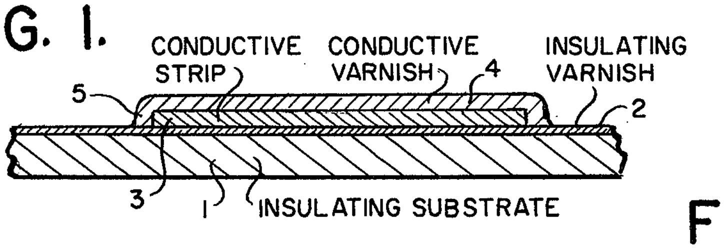
FIG. 1 is a cross sectional view taken through a circuit board produced by the method of the present invention.

As shown in FIG. 1, a comparatively thin coat of varnish 2 is applied to a substrate 1 of insulating material, and then a conductor strip 3 is formed on this varnish coating, for example by printing, which consists in a preferred manner of silver.

Lastly, a coat of a conductivized varnish 4 is applied to all of the conductor strips on the circuit board, and it extends in a preferred manner also beyond the marginal area of the conductor strips, as indicated at 5. The electrical conductivity of the varnish is achieved preferably by a carbon black filling.

Accordingly, in the circuit board prepared in accordance with the invention, the individual conductor strips are hermetically sealed in, namely by the varnish coat 2 on the one side and by the so-called conductive varnish coat 4 on the other.

If the conductor strip is to be contacted and provided with circuit components on both sides, the same layered structure is formed accordingly on the other side of the board 1, in which case the special advantage is additionally obtained that the moisture absorption of the substrate 1 is greatly reduced by the varnish coat 2 applied to both sides.

It is to be noted that the method of the invention is not restricted to the illustrated embodiment, but that a plurality of crossing conductor strips can be formed on one side of the substrate 1, an insulating varnish being applied in the usual manner at the intersections so as to avoid short circuits at these points.

In accordance with another possible embodiment, a conductive varnish conductor strip can be formed instead of the silver conductor strip, in which case the covering coat 4 of conductive varnish as well as the varnish coat 2 can be eliminated. This last embodiment is applicable particularly in conjunction with a high-resistance keyboard, in which case, however, the ohmic resistance of a particular conductive varnish conductor strip can also be adjusted as required, both by the thickness and by the width of this strip.

Figure 3:
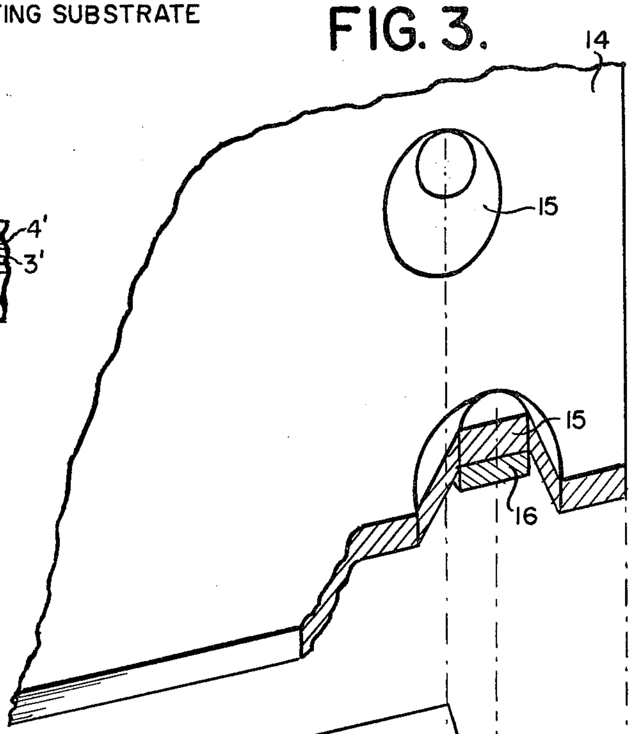
FIG. 3 is a partial cross section of a perspective view of an additional element of the embodiment of FIG. 2.
Figure 2:
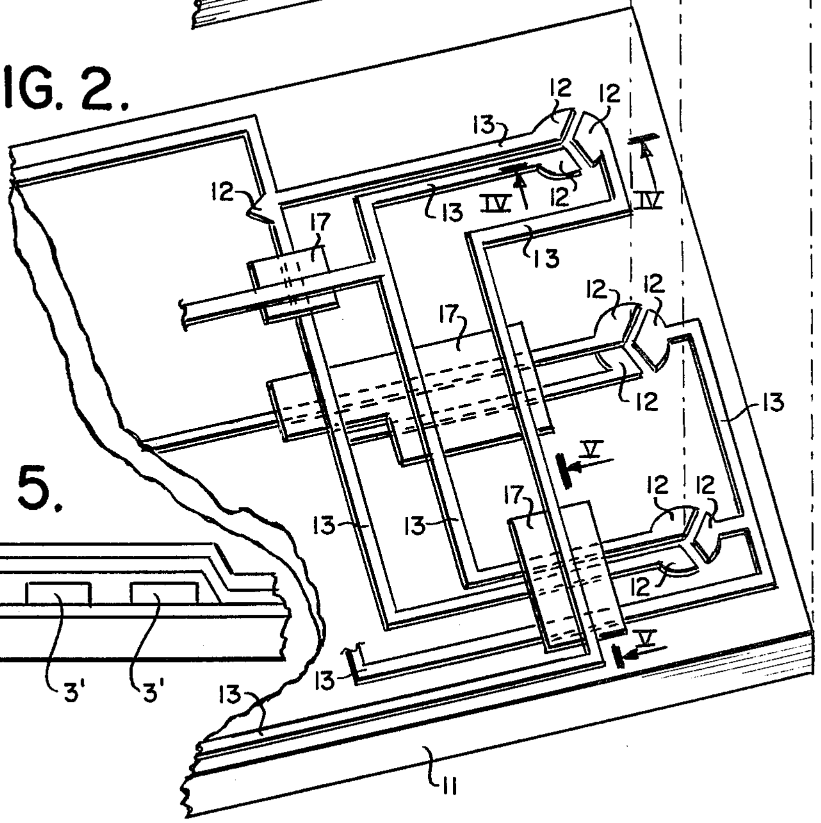
FIG. 2 is a perspective view of a specific embodiment of the circuit board of FIG. 1.

FIG. 2 shows a specific embodiment utilizing the circuit board obtained by the method of the invention, the embodiment being a keyboard comprising a circuit board including a substrate 11 on which switching contact pads 12 and conductor lines 13 are printed. FIG. 3 depicts an elastic mat 14 which is placed on circuit board 1, the mat being provided with pushbuttons 15 of integral design. Electrically conducting contacts 16 are inserted within pushbuttons 15, the contacts cooperating electrically with switching contact pads 12 on the circuit board. When a pushbutton 15 is depressed, contact 16 contacts a corresponding switching contact pad 12. When the pressure on the pushbutton 15 is released, the latter is returned, by the spring action due to the elastic material of mat 14, automatically to the original position and is disconnected from switching contact pad 12.

Figure 4A:
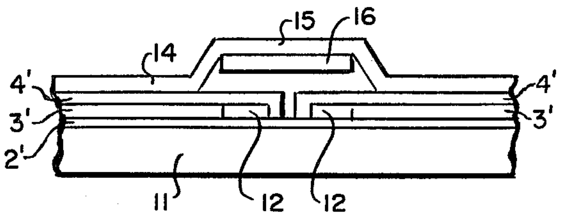
FIG. 4A is a sectional view through line IV—IV of FIG. 2.

As shown in FIG. 4A, switching contact pads 12 and conductor lines 13, when formed by the method of the present invention, are provided on substrate 11 having an insulating varnish coating 2′ thereon. The conductor lines 13 include metal conductor strips 3′ having a conductive varnish 4′ thereover. The contact pads 12 also have a varnish 4′ thereon and extending therearound as shown, in order to prevent migration. The switching contact pads 12 can be provided with one input and one output and also with one input and two outputs, as shown in FIG. 2.

As mentioned with respect to FIG. 4A, the layer of conductive varnish 4′ is applied down to the insulating layer 2′ in the area of the switch contact pads 12 such that any silver migration, when the conductor lines are silver in the preferred embodiment, and short circuiting is prevented between respective switch contact pads.

Figure 4B:
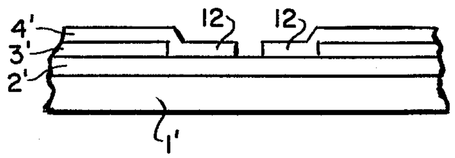
FIG. 4B is an alternative embodiment of that shown in FIG. 4A.

In an alternative embodiment shown in FIG. 4B, the need for the metallic conductor strip for pad 12 can be obviated if the conductive layer 4′ is printed over and around the conductor line 3′ and into the area of the switch contact 12 and thus act as the switch contact pad 12 itself. This is possible because the varnish layer 4′ is electrically conductive.

Likewise, in a further embodiment at least part of the conductor strips 3′, such as of silver, can be left out and instead only the conductor line comprising the conductive varnish is utilized.

Figure 5:
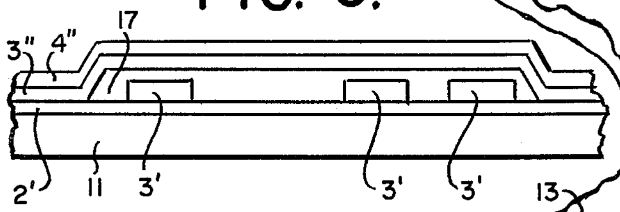
FIG. 5 is a sectional view through line V—V of FIG. 2.

In order to simplify the layout of conductor lines 13 and to make the circuit board small in size, intersections are formed on the circuit board with intersecting conductor strips as shown in FIG. 2. FIG. 5 shows in detail that this intersecting is accomplished by an insulating layer 17 of insulating varnish formed between the lower conductor line 3′ and an upper conductor line 3″. Thereafter, a coating of conductive varnish 4′ is applied over the uppermost conductor line 3″ to hermetically seal same between the coating 4′ and the insulating layers 2′ and 17. The intersecting lines are therefore insulated electrically from one another and the overall function of the unit is insured. Moreover, a final insulating varnish layer can be provided over the circuit board if desired.

According to the method of the invention, the insulating varnish 2′ is applied to the substrate 11 and thereafter conductor lines 3′ are printed, preferably in silver, onto the insulating varnish 2′. Thereafter, the insulating layer 17 required for the intersection is applied over the conductor lines 3′ and partly also over the insulating varnish 2′. Above the insulating layer 17 is conductor line 3″ which intersects the conductor lines 3′ which are lying underneath it and finally a layer of conductive varnish 4′ is then printed over all of the topmost conductor lines 3″.

In another embodiment, not shown, a printed layer of conductive varnish can be disposed around the conductor lines 3′ to hermetically seal same between this layer and layer 2′. However, this is not a preferred embodiment since it involves an additional work step in the process.

The method of the present invention is particularly useful in complex circuit board arrangements such as that shown in FIG. 2 wheren it is necessary for particular circuit lines 13 to both intersect below and above other circuit lines. This can be produced according to the method of the present invention and involves that the different intersections be printed in a sequence of superimposed layers by repeated and exact printing thereof. Thus two printing processes are required for the conductor lines which pass above and below other conductor lines and additionally, a third printing process is needed for the application of the sandwiched insulating layers 17.

What is claimed is:

1. A circuit board comprising a substrate of insulating material; an insulating varnish coating applied to at least one side of the substrate; a first set of nonintersecting conductive lines on each varnish coating; a coating of insulating varnish on and around the conductive lines only in the vicinity of desired intersections; a second set of nonintersecting conductive lines which have at least one portion of at least one line thereof superimposed over a portion of at least one other line of the first set of lines and separated therefrom by the insulating varnish coating; a plurality of groups of electrically conducting switch contact pads, wherein each switch contact pad is associated with a particular conductor line; a plurality of actuatable pushbuttons each cooperating electrically with one of the switch contact pads on the circuit board to electrically connect same; and a coating of conductive varnish over the exposed portions of the first and second sets of conductive lines.

2. A circuit board according to claim 1 furthur comprising a coating of conductive varnish over the exposed portions of the first and second sets of conductive lines.

3. The circuit board according to claim 1 wherein the conductive strips are hermetically encapsulated by the first mentioned insulating varnish coating and the conductive varnish coating.

4. The circuit board according to claim 1 wherein the conductive lines comprise one of a strip of conductive varnish or a metallic strip with a coating of conductive varnish thereover.

5. A circuit board according to claim 1 wherein the pushbuttons comprise an elastic mat disposed upon the circuit board and including integral pushbutton shaped elements and electrically conducting contacts disposed inside the pushbutton elements and in alignment above one group of switch contact pads, wherein each contact is moveable towards its corresponding group of switch contact pads on the circuit board to electrically connect same.

6. The circuit board according to claim 1 wherein the switch contact pads comprise one of a printed metal base portion covered by a conducting varnish or a base of conductive varnish.

7. The circuit board according to claim 1, wherein the conductive strips are hermetically encapsulated by the first mentioned insulating varnish coating and the conductive varnish coating.

8. The circuit board according to claim 1, wherein the conductive lines comprise one of a strip of conductive varnish or a metallic strip with a coating of conductive varnish thereover.

* * * * *